United States Patent [19]

Possin

[11] Patent Number: 5,648,654
[45] Date of Patent: Jul. 15, 1997

[54] FLAT PANEL IMAGING DEVICE WITH PATTERNED COMMON ELECTRODE

[75] Inventor: George Edward Possin, Niskayuna, N.Y.

[73] Assignee: General Electric Company, Schenectady, N.Y.

[21] Appl. No.: 576,324

[22] Filed: Dec. 21, 1995

[51] Int. Cl.$^6$ ...................................................... H01J 40/14
[52] U.S. Cl. ........................ 250/208.1; 257/443; 348/294
[58] Field of Search ............................. 250/208.1, 559.05; 257/291, 292, 443, 222–229, 59; 348/249, 250, 241, 294, 311; 345/55, 56, 58, 92

[56] References Cited

U.S. PATENT DOCUMENTS

| | | | |
|---|---|---|---|
| 4,873,516 | 10/1989 | Castleberry | 345/58 |
| 5,121,214 | 6/1992 | Turko et al. | 257/225 |

Primary Examiner—Que Le
Attorney, Agent, or Firm—Donald S. Ingraham

[57] ABSTRACT

A flat panel radiation imaging device that exhibits reduced capacitive coupling between pixel photodiode electrodes and readout data lines, and thus exhibits reduced phantom images and image artifacts in operation, includes a low-capacitive-coupling common electrode disposed over a pixel array of photosensors, switching transistors, and address lines that are arranged in an imaging array pattern of rows and columns. The low-capacitive coupling common electrode includes a plurality of common electrode column segments oriented along the same axis as the data lines in the array, with each of the common electrode column segments corresponding to a respective column of photosensors in the imaging array pattern. Each of the common electrode column segments is disposed so as to have a non-zero setoff distance from data line adjacent to a column of photosensors and so as to overlie the photosensor pixel electrode by a selected overlap distance between the common electrode column segment and the pixel electrode in the pixel.

7 Claims, 2 Drawing Sheets

FLAT PANEL IMAGING DEVICE WITH PATTERNED COMMON ELECTRODE

BACKGROUND OF THE INVENTION

This invention relates generally to solid state radiation imagers and in particular to structures in such imagers to reduce phantom noise and image artifacts.

Solid state radiation imagers typically comprise a large flat panel imaging device having a plurality of pixels arranged in rows and columns. Each pixel includes a photosensor, such as a photodiode, that is coupled via a switching transistor to two separate address lines, a scan line and a data line. In each row of pixels, each respective switching transistor (typically a thin film field effect transistor (FET)) is coupled to a common scan line through that transistor's gate electrode. In each column of pixels, the readout electrode of the transistor (e.g., the source electrode of the FET) is coupled to a data line, which in turn is selectively coupled to a readout amplifier. Devices such as described herein are commonly referred to as flat panel imagers.

During nominal operation, radiation (such as an x-ray flux) is pulsed on and the x-rays passing through the subject being examined are incident on the imaging array. The radiation is incident on a scintillator material and the pixel photosensors measure (by way of change in the charge across the diode) the amount of light generated by x-ray interaction with the scintillator. Alternatively, the x-rays can directly generate electron-hole pairs in the photosensor (commonly called "direct detection"). The photosensor charge data are read out by sequentially enabling rows of pixels (by applying a signal to the scan line causing the switching transistors coupled to that scan line to become conductive), and reading the signal from the respective pixels thus enabled via respective data lines (the photodiode charge signal being coupled to the data line through the conductive switching transistor and associated readout electrode coupled to a data line). In this way a given pixel can be addressed though a combination of enabling a scan line coupled to the pixel and reading out at the data line coupled to the pixel.

The performance of flat panel imaging devices is degraded by capacitive coupling between data lines and the pixel photodiode electrodes. In particular, during some common imager operations the x-ray flux remains on during readout of the pixels. One example of such operations is fluoroscopy in small or less sophisticated units as might be used in surgery or portable applications; such units use light weight and low cost x-ray generators which must be on continuously to produce an adequate output signal. Such units further typically are not adapted to rapidly cycle the x-ray beam on and off during relevant periods to prevent radiating during the readout periods. Another example is imagers used in conjunction with radiation therapy in which the radiation source is on continuously (to maximize delivered dose) or is pulsed on periodically, which pulses can occur during the readout period. This simultaneous excitation of the imager while reading out pixels results in image artifacts or "phantom" images. The phantom images occur as a result of capacitive coupling between the respective photodiode electrodes and adjacent data lines; during the readout of a given pixel attached to a given data line, the potential of the other pixel electrodes (e.g., the non-read pixels) continue to change as the radiation flux strikes the imager. The change in potential of the pixels not being read out is capacatively coupled into the data line, thereby inducing an additional charge which is read out by the amplifier and presented as part of the signal from the addressed pixel. This effect produces cross-talk or contrast degradation in the image, and is commonly evidenced as bright lines in the display readout.

It is desirable that a solid state imager array exhibit minimal cross-talk and be capable of generating a stable and accurate image in multiple modes of operation, including modes in which pixels are being read out while the x-ray flux is being applied.

SUMMARY OF THE INVENTION

A flat panel radiation imaging device that exhibits reduced capacitive coupling between pixel photodiode electrodes and readout data lines, and thus exhibits reduced phantom images and image artifacts in operation, includes a low-capacitive-coupling common electrode disposed over a pixel array of photosensors, switching transistors, and address lines that are arranged in an imaging array pattern of rows and columns. The low-capacitive coupling common electrode includes a plurality of common electrode column segments oriented along the same axis as the data lines in the array, with each of the common electrode column segments corresponding to a respective column of photosensors in the imaging array pattern. Each of the common electrode column segments is disposed so as to have a non-zero setoff distance from data line adjacent to the columns of photosensors and so as to overlie the photosensor pixel electrode by a selected overlap distance, the distance typically being in the range of between 1 and 10 times the vertical separation between the common electrode column segment and the pixel electrode.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1A:
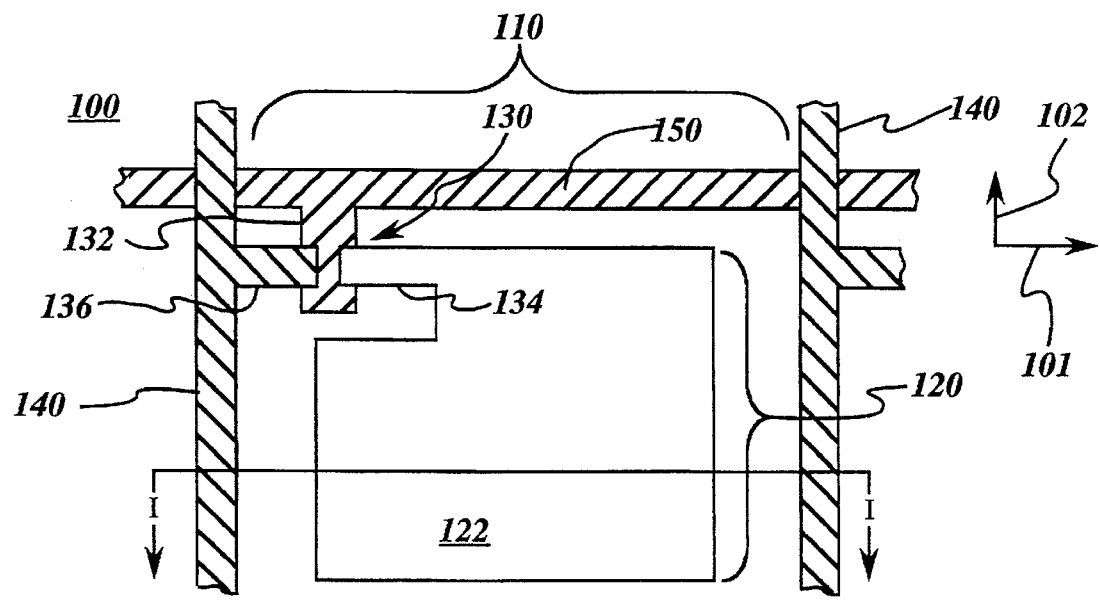
FIG. 1(A) is a plan view of a portion of an imager array in accordance with the prior art.

A solid state radiation imager 100 comprises a plurality of pixels 110 (a representative one of which is illustrated in FIG. 1(A)) that are arranged in a matrix-like imager array pattern comprising rows and columns of pixels 110. For purposes of illustration and not limitation, imager 100 has a first axis 101 that is the axis along which the rows of pixels are aligned, and a second axis 102 that is the axis along which the columns of pixels are aligned. Each pixel 110 comprises a photosensor 120 and a thin film switching transistor 130. Photosensor 120 typically comprises a photodiode having a pixel electrode 122 that corresponds with the active (that is, photosensitive) area of the device. Switching transistor 130 typically comprises a thin film field effect transistor (FET) having a gate electrode 132, a drain electrode 134 and a source electrode (or readout electrode) 136. Imager 100 further comprises a plurality of data lines 140 and scan lines 150 (collectively referred to as address lines). At least one scan line 150 is disposed along first axis 101 for each row of pixels in the imager array pattern. Each scan line is coupled to the respective gate electrodes 132 of pixels in that row of pixels. At least one data line is disposed along second axis 102 for each column of pixels in the imager array pattern, and is coupled to the respective readout electrodes 136 of pixels in that column of pixels.

Figure 1B:
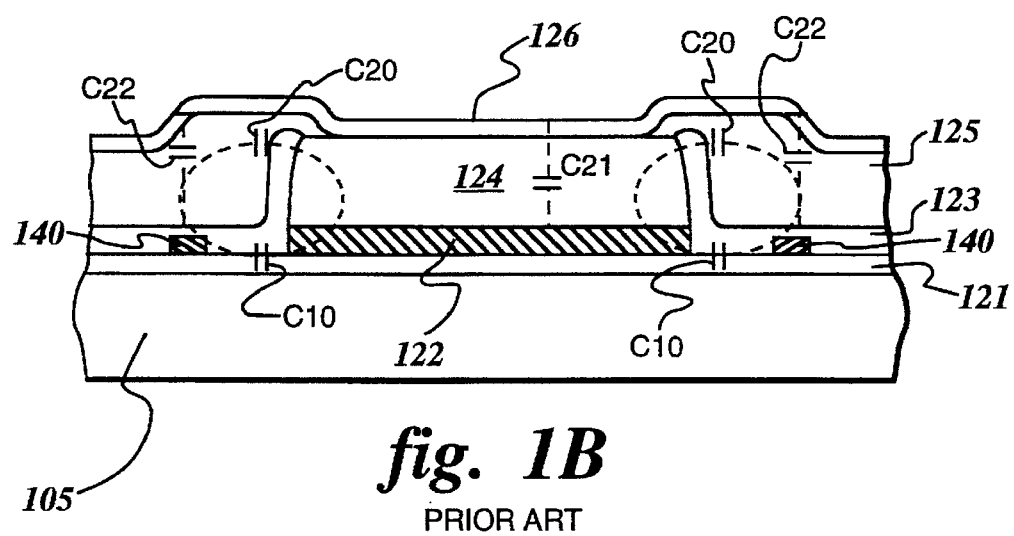
FIG. 1(B) is a partial cross-sectional view of a representative pixel taken along line I—I of FIG. 1(A).

A partial cross-sectional view of one pixel 110 is presented in FIG. 1(B). Photodiode 120 is disposed over a substrate 105. A first dielectric material layer 121 is typically disposed between pixel electrode 122 and substrate 105. Photodiode 120 further comprises a photosensitive material body 124 (typically comprising amorphous silicon) that is electrically coupled to a common electrode 126 that is disposed over the imager array. Common electrode 126 comprises an optically transmissive and electrically conductive material, such as indium tin oxide or the like. A second dielectric material layer 123, typically comprising silicon nitride or the like, extends over a portion of the sidewalls of the photosensitive material body 124, and a third dielectric layer 125, comprising polyimide or the like, is disposed between common electrode 126 and other components in the imager array (except for the contact point to photosensitive material body 124 through a via in second dielectric material layer 123 and third dielectric layer 125).

In an imager array as illustrated in FIG. 1(B), there are several sources of capacitive coupling between conductive components in the array. For example, there is capacitive coupling between each data line 140 and adjacent pixel electrodes 122. As used herein, "adjacent" conductive components refers to components that are spatially near one another but not in direct physical contact so that no direct conductive path (or short circuit) exists between the two components. For analysis purposes, the coupling between a data line and an adjacent photodiode base electrode is broken down into a first capacitance $C_{10}$ (the representation in phantom in FIG. 1(B) is for illustrative purposes and does not represent a separate capacitor component in the array) that predominantly represents coupling though the substrate and materials disposed under the pixel electrode 122 (as used herein, "under", "over", "above" and the like are used to refer to the relative position of a component with respect to substrate 105, and does not in any way connote any limitation on the orientation, use, or operation of the imager array). A second capacitance $C_{20}$ denotes capacitive coupling through component above base electrode 122. It has been observed that the "lower" path capacitance, $C_{10}$, frequently is a larger contributor to induced capacitance than the "upper" path capacitance, $C_{20}$. Other sources of capacitive coupling are between pixel electrode 122 and common electrode 126 (denoted as $C_{21}$ in FIG. 1(B)), between data line 140 and common electrode 126 (denoted as $C_{22}$ in FIG. 1(B)), and some capacitance due to proximity of the data line to the FET structures and crossover regions (not shown) (e.g., crossing over scan lines). The primary source of capacitance for a given data line is expressed as:

$$C_{data\ line} = 2(C_{10} + C_{20}) + C_{22}$$

For most data lines in the array (that is, other than data lines along the array boundary that are not adjacent to pixels on either side), $C_{data\ line}$ is a function of the induced capacitance to pixels on either side of the data line, hence the factor of two with respect to the sum of $C_{10}$ and $C_{20}$.

Data line capacitance contributes to imager noise in two ways. First, it is an additional load on the amplifier (not shown) that is used to read the charge on a given pixel during the readout sequence in imager operation. Although the effect of this load can vary dependent on amplifier design, generally electrical noise resulting from the data line capacitance increases proportional to the data line capacitance once the capacitance is larger than the amplifier input capacitance. The amplifier input capacitance is commonly on the order of 30 pf; total data line capacitance is about 30 pf for a 10 cm long data line in an array having a pitch of about 200 µm. Second, data line capacitance is the source of noise due to the data line resistance. For example, the data line resistance noise ($N_{Data\ Line}$) can be expressed as follows:

$$N_{Data\ Line} = \sqrt{[(8)(K)(T)(R_{data\ line})(Amp_{NBW})]} \times (C_{data\ line})$$

in which:

K is the Boltzman constant;

T is the absolute temperature:

$R_{data\ line}$ is data line resistance;

$C_{data\ line}$ is data line capacitance; and $Amp_{NBW}$ is the noise bandwidth of the amplifier.

The capacitive coupling effect is most often of concern in operations in which the imager is excited (that is, the radiation of interest (e.g., x-rays) are incident on the imager) during all or a portion of the time the pixels are being read out. The signal read out during the period of time that the imager is excited will be larger than when the imager is not being excited. One approximation of this increased normalized to average signal can be expressed as:

$$2\left[\left(\frac{C_{10}+C_{20}}{C_{pixel}}\right)\right] \times \left[\frac{\text{\# pixels per readout channel}}{\text{\# of scan lines with pixels exposed to radiation beam}}\right] \times$$

$$\left[\frac{\text{integration time}}{\text{line scan time}}\right]$$

The expression ($C_{10}+C_{20}$) represents the coupling capacitance between a single pixel electrode and one adjacent data line; in the array layout, each data line 140 is typically adjacent to two pixel electrodes 140. The ratio of the amplifier integration time to line scan time is relatively small, about 0.85 (third term in the equation). In continuous fluoroscopy, or in pulsed fluoroscopy if the beam on time is a significant fraction of interframe time, then the second term in the equation has a value of approximately 1 and the size of the coupling effect is $2[(C_{10}+C_{20})/C_{pixel}]$, which ratio provided a useful way to characterize the magnitude of the capacitive coupling effect. For imagers having the construction described above with respect to FIGS. 1(A) and 1(B), the value of $2[(C_{10}+C_{20})/C_{pixel}]$ calculated from the structure or inferred from imager data is in the range of about 0.5%. This value is significant because typical contrast modulation in x-ray imagers is in the range between about 0.1% and about 10%.

Figure 2A:
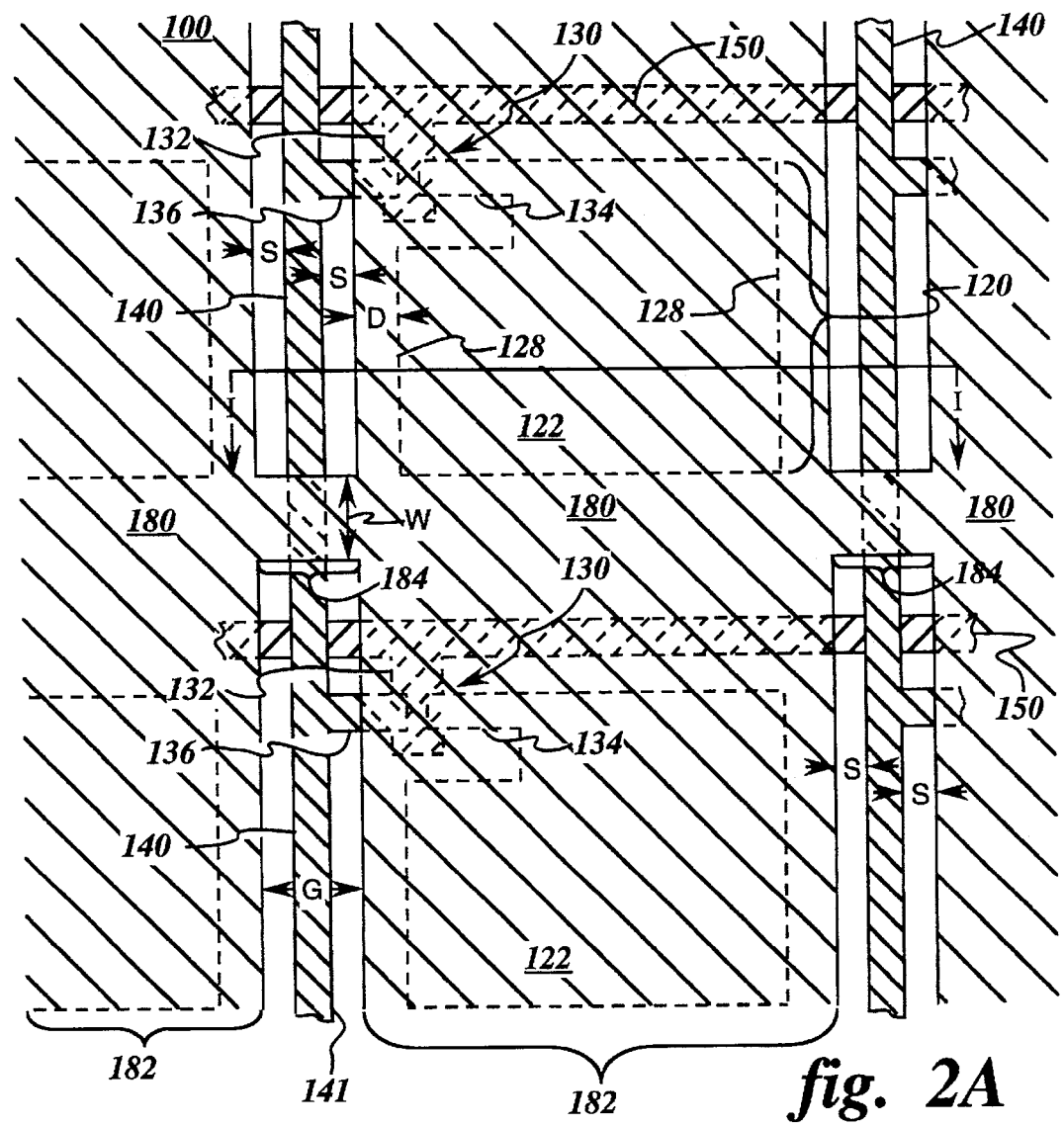
FIG. 2(A) is a partial plan view of a representative portion of the imaging array in accordance with one embodiment of the present invention.
Figure 2B:
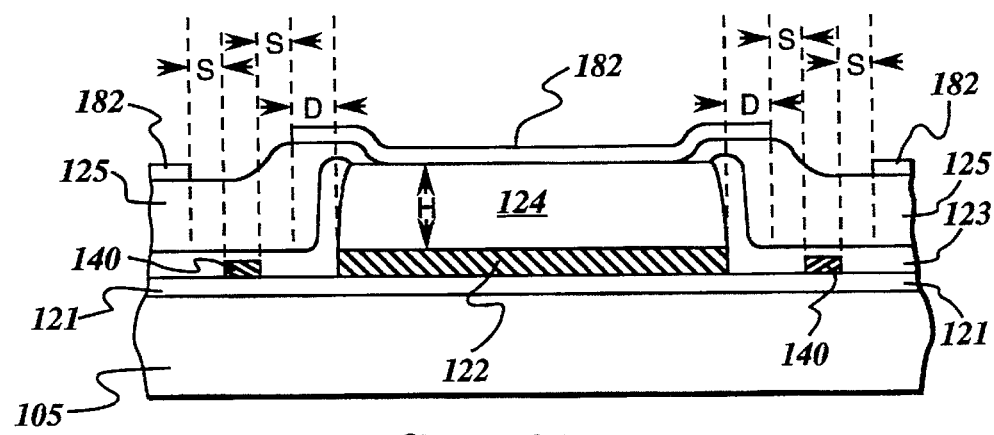
FIG. 2(B) is a cross-sectional view of a representative portion of the imaging array pattern in accordance with the present invention.

In accordance with this invention, radiation imager 100 as described above comprises a low capacitive-coupling patterned common electrode 180 that is disposed over the array photosensors, as illustrated in FIGS. 2(A) and 2(B). Patterned electrode 180 comprises a plurality of common electrode columns 182 that are oriented along second axis 102 of the array such that each respective common electrode column 182 is disposed over a corresponding column of photosensors 120 in the army structure. Each common electrode column segment 182 is further disposed such that it does not overlie adjacent data lines 140. Adjacent common electrode column segments 182 are electrically coupled to be maintained at a common potential; typically, the respective common electrode column segments 182 are coupled together by at least one common electrode cross-connect segment 184 that is disposed between the column segments; such cross-connect segments can be disposed at every pixel or alternatively at multiple-pixel increments along the array, or alternatively only at the edges of the array. In a further alternative embodiments, common electrode column segments may be respectively coupled to a common voltage potential (not shown) off of the array or alternatively to conductive cross-connect shunts off of the array.

Each common electrode column segment 182 is disposed over a corresponding column of photosensors 120 such that a non-zero overlap distance "D" exists between the edge of common electrode column segment 182 and a pixel second axis boundary edge 128 of photosensor pixel 122 (overlap distance D is determined with respect to boundary edge 128 (oriented along second axis 102) at the portion of pixel electrode 122 underlying the photosensor body (e.g., the semiconductive material of the photodiode) as illustrated in FIG. 2(A) and not in the region of TFT 130). The magnitude of overlap distance "D" between common electrode column segment 182 and pixel boundary 128 is typically in the range between about 1 and 10 times the vertical separation distance "H" between pixel electrode 122 and the portion of common electrode 180 overlying the pixel electrode, and the nominal overlap distance "D" is about 3H. In the typical large area imager (e.g., having a pixel array area of about 100 cm$^2$ or more), "H" typically is in the range of between about 1 µm and about 2 µm, and the overlap distance "D" is in the range between about 1 µm and 20 µm. From a design standpoint, the lower (or minimum) value of overlap distance "D" is governed by the concern to have sufficient overlap distance to provide a desired reduction in capacitive coupling between the common electrode and the pixel electrode (while providing sufficient common electrode coverage of photosensor 120 to ensure efficient charge collection at pixel electrode 122 during operation of the imager), and the upper (or maximum) value of overlap distance "D" is governed by the need to maintain a sufficiently high fill factor in the array, that is, the portion of the array area that is occupied by the photosensitive elements of pixels 110. For large area arrays in accordance with this invention, fill factors of about 80% or more are achievable while still maintaining sufficient overlap distance to reduce undesirable capacitive coupling effects.

Common electrode column segments 182 are further disposed such that each segment has a selected setoff distance "S" between boundary edge 141 of data line electrode 140 disposed adjacent to the column of photosensors 120 underlying the respective common electrode column segment 182 and the boundary (oriented along second axis 102) of the overlying common electrode column segment 182. Setoff distance "S" is typically in the range between about 4 µm and 40 µm, and nominally about 5 µm. The absence of the portion of the common electrode that in prior art imagers was disposed over data lines 140 lessens the capacitive coupling between the common electrode and the data lines.

From a design standpoint, the magnitude of both setoff distance "S" and overlap distance "D" must be considered in combination. For example, if both D and S are large (magnitudes), the array has a poor fill factor; if S is small, data line capacitance increases and the imager exhibits higher noise; if D is small, the imager exhibits increased capacitive coupling.

In one embodiment of the present invention illustrated in FIG. 2(A), cross-connect segment 184 is disposed between adjacent common electrode column segments 182 to electrically couple the respective column segments together. Cross connect segment 184 is disposed over a portion of data line 140 that lies between adjacent common electrode column segments 182. For purposes of illustration and not limitation, cross connect segment 184 as illustrated in FIG. 2(A) is shown disposed in the lower portion of a pixel 110; alternatively, cross-connect segment 184 is disposed over scan line 150 or over TFT 130. The width "W" of cross-connect segment 184 is typically in the range of about 5% to about 40% of the gap distance "G" between the boundaries (along second axis 102) of adjacent common electrode column segments 182.

Low capacitive-coupling patterned electrode 180 typically comprises a substantially optically transmissive and electrically conductive material such as indium tin oxide, tin oxide, zinc oxide, or the like, that is deposited over the array in a sputter, evaporation, chemical vapor deposition, or similar process and then patterned using photolithographic etching techniques to provide the desired dimensions of respective common electrode column segments 182 and cross-connect segments 184. The thickness of patterned common electrode 180 is typically in the range between about 20 nm and 400 nm for indium tin oxide electrode material. Some parts of the common electrode may be opaque conductors such as a metal to shield the FET from light or to increase the electrical conductivity of the common electrode.

In accordance with this invention, a flat panel radiation imaging device having a low capacitive-coupling patterned common electrode exhibits enhanced performance as the structure provides reduced induced capacitance between data lines and the common electrode, with a consequent reduction of phantom images and image artifacts during imager operation. Imager 100, having low capacitive-coupling patterned common electrode 180 in accordance with this invention, exhibits reduced data line capacitance, in comparison with prior art imagers; for example, in an array having a data line having a length of about 10 cm with a pixel pitch of about 200 µm (that is, the center to center distance between adjacent pixels in a column), it has been calculated that the capacitance of a given data line in an imager in accordance with the present invention is about 22 pf, as compared with a data line capacitance of about 35 pf in a similarly-sized prior art imager.

It will be apparent to those skilled in the art that, while the invention has been illustrated and described herein in accordance with the patent statutes, modifications and changes may be made in the disclosed embodiments without departing from the true spirit and scope of the invention. It is, therefore, to be understood that the appended claims are intended to cover all such modifications and changes as fall within the true spirit of the invention.

What is claimed is:

1. A flat panel radiation imaging device for generating images with reduced image artifacts during read-out of the imager, the imaging device comprising:

a pixel array disposed on a substrate, said pixel array comprising a plurality of pixels disposed in an imaging array pattern comprising rows and columns, each of said pixels comprising a photosensor coupled to a thin film transistor (TFT);

said pixel array further comprising a plurality of address lines disposed in said imaging array pattern, said address lines comprising a plurality of scan lines disposed in rows oriented along a first axis and a plurality of data lines disposed in respective columns oriented along a second axis;

a low capacitive-coupling common electrode disposed over said pixel array, said low capacitive-coupling common electrode comprising a plurality of common electrode column segments oriented along said second axis, each of said common electrode column segments corresponding to a respective column of photosensors in said imaging array pattern, each of said common electrode column segments further being disposed so as to have a non-zero setoff distance from data lines adjacent to said columns of photosensors.

2. The imaging device of claim 1 wherein said low capacitive coupling common electrode common electrode column segments further are disposed so as to overlie an active photosensitive area of each of the photosensors disposed in the respective column of said imaging array pattern, each of said common electrode column segments further having a selected overlap distance beyond a second axis-oriented boundary of a respective pixel electrode disposed in each of said photosensors in said respective column.

3. The imaging device of claim 2 wherein the magnitude of said overlap distance is in the range between about 1 and about 20 times the magnitude of the separation distance between said common electrode column segment and the respective pixel electrode.

4. The imaging device of claim 1 wherein said setoff distance between said common electrode column segment and the boundary edge oriented along said second axis of an adjacent data line is in the range between about 3 µm and 20 µm.

5. The imaging device of claim 1 wherein each scan line corresponds to one row of pixels in said imaging array pattern, each of said scan lines being coupled to a respective gate electrode in said pixel switching transistors for each pixel disposed along the respective row of pixels in said imaging array pattern and each data line corresponds to one column of pixels in said imaging array pattern having a corresponding data line, each of said data lines being coupled to a respective readout electrode in said pixel switching transistors for each pixel disposed along the respective column of pixels in said imaging array pattern, said common electrode further comprising cross-connect segments extending between adjacent common electrode column segments.

6. The imaging device of claim 5 wherein said common electrode cross-connect segments collectively occupy an area between respective common electrode column segments in the range between about 5% and 40% of the total area between respective common electrode column segments.

7. The imaging device of claim 1 wherein said common electrode comprises an optically transmissive conductive material selected from the group consisting of indium tin oxide, tin oxide, and zinc oxide, and has a thickness in the range between about 20 nm and about 40 nm.

* * * * *